(12) United States Patent
Katou

(10) Patent No.: US 6,526,554 B1
(45) Date of Patent: Feb. 25, 2003

(54) INTEGRATED CIRCUIT LAYOUT SYSTEM, INTEGRATED CIRCUIT LAYOUT METHOD, AND COMPUTER-READABLE STORAGE MEDIUM STORING PROGRAM THEREFOR

(75) Inventor: Akitosi Katou, Kanagawa (JP)

(73) Assignee: NEC Corporation, Tokyo (JP)

( * ) Notice: Subject to any disclaimer, the term of this patent is extended or adjusted under 35 U.S.C. 154(b) by 44 days.

(21) Appl. No.: 09/665,174

(22) Filed: Sep. 19, 2000

(30) Foreign Application Priority Data

Sep. 20, 1999 (JP) .......................................... 11-264812

(51) Int. Cl.⁷ ................................................ G06F 9/45
(52) U.S. Cl. ................................. 716/10; 716/8; 716/9; 716/11
(58) Field of Search ............................. 716/1–2, 4–12, 716/14, 16–17, 19; 257/206; 438/129; 326/41

(56) References Cited

U.S. PATENT DOCUMENTS 5,012,427 A   4/1991   Kuribayashi 6,327,695 B1 * 12/2001  Bothra et al. .................. 716/8

FOREIGN PATENT DOCUMENTS

| JP | 1-241146   | 9/1989  |
| JP | 02-309657  | 12/1990 |
| JP | 5-230547   | 9/1993  |
| JP | 10-223869  | 8/1998  |
| JP | 10-303306  | 11/1998 |
| JP | 11-031747  | 2/1999  |
| JP | 11-110438  | 4/1999  |

* cited by examiner

*Primary Examiner*—Matthew Smith
*Assistant Examiner*—Naum Levin
(74) *Attorney, Agent, or Firm*—Foley & Lardner

(57) ABSTRACT

A dummy gate processing unit obtains a netlist and generates a dummy-gate-inserted netlist (step S13). In accordance with the netlist stored in a netlist storing unit, a floor plan processing unit makes module divisions and performs grouping (step S16). Besides, the floor plan processing unit distributes dummy gates to the individual target modules divided, and then makes area divisions in the respective target modules (step S18). A layout processing unit determines such coordinates that the dummy gates are arranged uniformly within the respective divided areas (step S22), arranges all cells, and install all net wiring (step S25).

10 Claims, 8 Drawing Sheets

INTEGRATED CIRCUIT LAYOUT SYSTEM, INTEGRATED CIRCUIT LAYOUT METHOD, AND COMPUTER-READABLE STORAGE MEDIUM STORING PROGRAM THEREFOR

BACKGROUND OF THE INVENTION

1. Field of the Invention

The invention relates to an integrated circuit layout system, an integrated circuit layout method, and a computer-readable storage medium storing a program therefor in which dummy gates can be appropriately arranged on a semiconductor chip.

2. Description of the Related Art

Recently, the development of technologies for fine semiconductor integrated circuits has paved the way for large-scale integrated circuits. However, this involves a number of cases where various defects of the semiconductor integrated circuit are found after a diffusion step and the like of the manufacturing process, which can not be found at design step. The occurrence of such post-design defects has required a redesign for the most part, leading to protracted development TAT (Turn Around Time).

To cope with such a problem, a technique of arranging dummy gates into an integrated circuit at the point of layout has been recently adopted to minimize redesigns. Dummy gates mean predetermined gates which are unused at the point of initial design and can be effectively used on correction.

More specifically, when post-design defects occur, dummy gates arranged in the integrated circuit can be used to redesign (rewire) the connections and the like of those correction-requiring portions alone, so as to reduce the development TAT.

Hereinafter, a conventional layout method of arranging dummy gates in an integrated circuit will be described with reference to the drawings. FIG. 1 is a flowchart showing conventional layout processing. FIG. 2 is a schematic diagram showing a conventional netlist having dummy gates inserted therein. FIG. 3 is a schematic diagram showing dummy gates being arranged irregularly within individual modules on a semiconductor chip with in-module divisions.

Initially, a netlist including dummy gates is generated (step S101). The netlist generated here has, for example, a hierarchical structure as shown in FIG. 2. This netlist includes divided target modules 2B, 2C, and 3A at different levels, and dummy gates g11–g13 associated with the same.

Then, the presence or absence of a floor plan is determined (step S102). If a floor plan is needed, module divisions are made (step S103) and grouping is performed (step S104).

Then, modules are arranged on a predetermined semiconductor chip (step S105). For example, as shown in FIG. 3, the individual modules included in the netlist are arranged at their predetermined positions on a semiconductor chip T11.

Finally, inter-module connections and other wiring are installed (step S106) to end the layout processing.

Such conventional layout processing, however, disposed dummy gates at random depending on the order of description in the netlist, the algorithm of the layout tool, and the like. As shown by black circles in FIG. 3, dummy gates dg were therefore scattered or concentrated over the target modules 2B, 2C, and 3A on the semiconductor chip T11, being far from uniform arrangement.

When the dummy gates dg were thus arranged at random on the semiconductor chip T11, it was sometimes impossible for these dummy gates dg to be used for logic changes since no available dummy gate dg existed within the area of allowable delays and the like, or no available dummy gate was in fan-out specifications.

That is, in such cases, the modification using dummy gates dg was impossible. This necessitated a redesign of the most part, resulting in a problem of precluding a reduction of development TAT.

SUMMARY OF THE INVENTION

An object of the present invention is to provide an integrated circuit layout system, an integrated circuit layout method, and a computer-readable storage medium storing a program therefor which make it possible to arrange dummy gates uniformly on a semiconductor chip for the reduction of development TAT.

A first aspect of an integrated circuit layout system according to the present invention comprises: dummy gate inserting unit for inserting dummy gate information into a netlist defining connections of circuit elements constituting an integrated circuit; dummy gate distributing unit for distributing a predetermined number of dummy gates to modules in accordance with the netlist having dummy gate information inserted therein by the dummy gate inserting unit; and dummy gate arranging unit for arranging the individual dummy gates distributed by the dummy gate distributing unit uniformly within respective module areas on a chip.

In the present invention, the dummy gate inserting unit inserts dummy gate information into a netlist which defines connections of circuit elements constituting an integrated circuit. The dummy gate distributing unit distributes a predetermined number of dummy gates to modules in accordance with the netlist having the dummy gate information inserted therein by the dummy gate inserting unit. Then, the dummy gate arranging unit arranges the individual dummy gates distributed by the dummy gate distributing unit uniformly within respective module areas on a chip. Accordingly, even when post-design defects occur, the dummy gates can be effectively used to redesign the connections and the like of those correction-requiring portions alone, within the areas of allowable delays and the like or within fan-out specifications. This allows a reduction in development TAT.

A second aspect of an integrated circuit layout system according to the present invention comprises: dummy gate inserting unit for inserting dummy gate information into a netlist defining connections of circuit elements constituting an integrated circuit; area designating unit for designating a plurality of areas on a chip to arrange circuit elements in accordance with the netlist having dummy gate information inserted therein by the dummy gate inserting unit; dummy gate distributing unit for distributing a predetermined number of dummy gates to the areas designated by the area designating unit; and dummy gate arranging unit for arranging the individual dummy gates distributed by the dummy gate distributing unit uniformly within the respective areas on the chip.

In the present invention, the dummy gate inserting unit inserts dummy gate information into a netlist which defines connections of circuit elements constituting an integrated circuit. The area designating unit designates a plurality of areas on a chip to arrange circuit elements in accordance with the netlist having the dummy gate information inserted therein by the dummy gate inserting unit. Then, the dummy gate distributing unit distributes a predetermined number of dummy gates to the areas designated by the area designating unit. The dummy gate arranging unit arranges the individual dummy gates distributed by the dummy gate distributing unit uniformly within the respective areas on the chip. Accordingly, even when post-design defects occur, the dummy gates can be effectively used to redesign the connections and the like of those correction-requiring portions alone, within the areas of allowable delays and the like or within fan-out specifications. This allows a reduction in development TAT.

In this invention, the dummy gate inserting unit may insert, for example, dummy gate information including at least the total number of dummy gates into the top level of a hierarchical netlist which defines connections of circuit elements constituting an integrated circuit. The dummy gate distributing unit may distribute all the dummy gates included in the dummy gate information in accordance with the number of circuit elements targeted for the distribution.

A first aspect of an integrated circuit layout method according to the present invention comprises: inserting dummy gate information into a netlist defining connections of circuit elements constituting an integrated circuit; distributing a predetermined number of dummy gates to modules in accordance with the netlist having dummy gate information inserted therein; and arranging the individual dummy gates distributed uniformly within respective module areas on a chip.

In the present invention, dummy gate information is inserted into a netlist which defines connections of circuit elements constituting an integrated circuit. A predetermined number of dummy gates are distributed to modules in accordance with the netlist having the dummy gate information inserted therein. Then, the individual dummy gates distributed are uniformly arranged within respective module areas on a chip. Accordingly, even when post-design defects occur, the dummy gates can be effectively used within the areas of allowable delays and the like or within fan-out specifications to redesign the connections and the like of those correction-requiring portions alone. This allows a reduction in development TAT.

A second aspect of an integrated circuit layout method according to the present invention comprises: inserting dummy gate information into a netlist defining connections of circuit elements constituting an integrated circuit; designating a plurality of areas on a chip to arrange circuit elements in accordance with the netlist having dummy gate information inserted therein; distributing a predetermined number of dummy gates to the areas; and arranging the individual dummy gates uniformly within the respective areas on the chip.

In the present invention, dummy gate information is inserted into a netlist which defines connections of circuit elements constituting an integrated circuit. A plurality of areas on a chip to arrange circuit elements are designated in accordance the netlist having the dummy gate information inserted therein in the step of inserting dummy gate information. Then, a predetermined number of dummy gates are distributed to the areas designated, and the individual dummy gates are uniformly arranged within the respective areas on the chip. Accordingly, even when post-design defects occur, the dummy gates can be effectively used within the areas of allowable delays and the like or within fan-out specifications to redesign the connections and the like of those correction-requiring portions alone. This allows a reduction in development TAT.

A computer-readable storage medium storing a program for making a computer execute the first integrated circuit layout method according to the present invention contains the procedures for: inserting dummy gate information into a netlist defining connections of circuit elements constituting an integrated circuit; distributing a predetermined number of dummy gates to modules in accordance with the netlist having dummy gate information inserted therein; and arranging the individual dummy gates uniformly within respective module areas on a chip.

A computer-readable storage medium storing a program for making a computer execute the second integrated circuit layout method contains the procedures for: inserting dummy gate information into a netlist defining connections of circuit elements constituting an integrated circuit; designating a plurality of areas on a chip to arrange circuit elements in accordance with the netlist having dummy gate information inserted therein; distributing a predetermined number of dummy gates to the areas; and arranging the individual dummy gates uniformly within the respective areas on the chip.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

Hereinafter, integrated circuit layout systems and integrated circuit layout methods according to the embodiments of the present invention will be described in detail with reference to the accompanying drawings.

Figure 1:
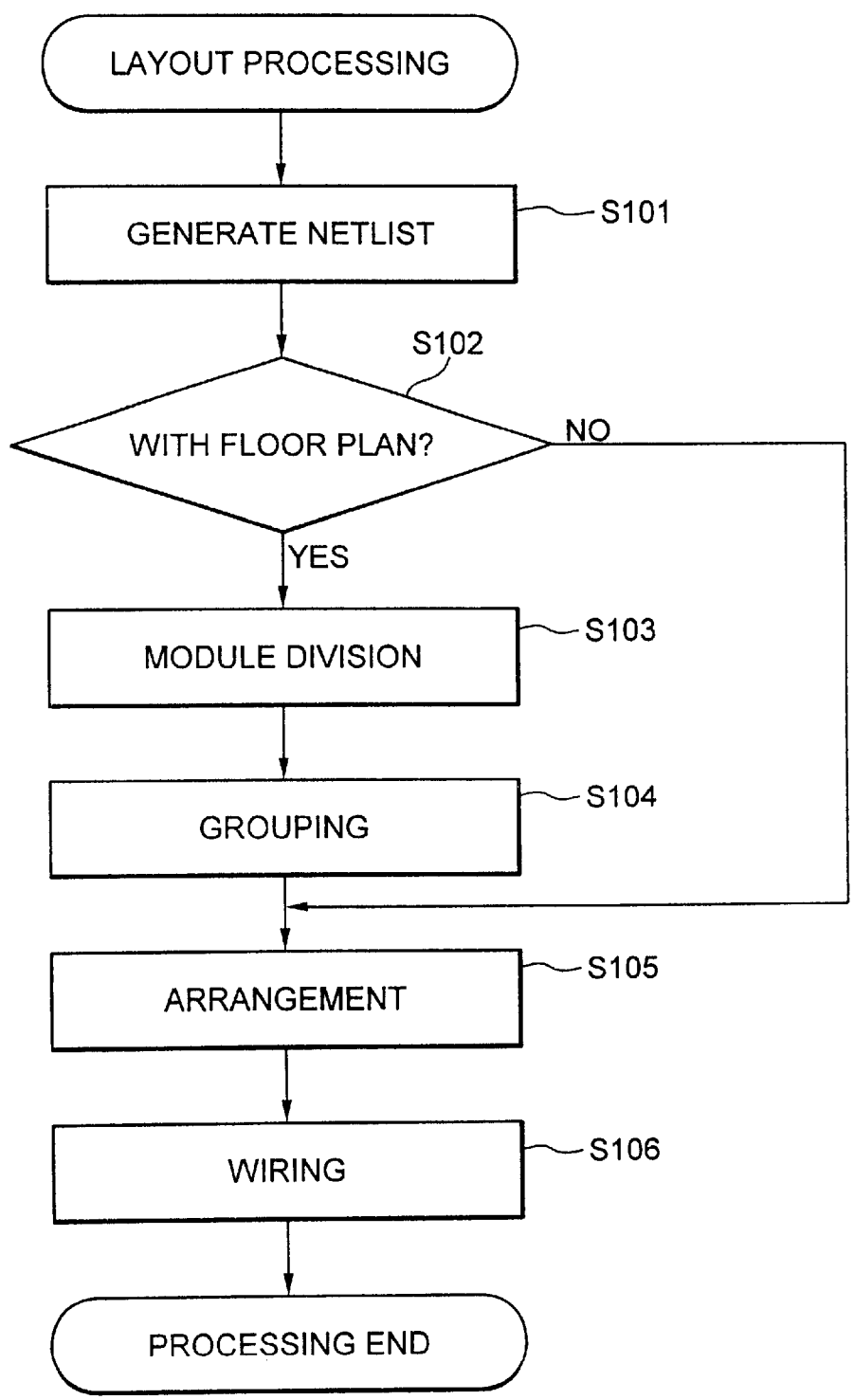
FIG. 1 is a flowchart for explaining conventional layout processing.
Figure 2:
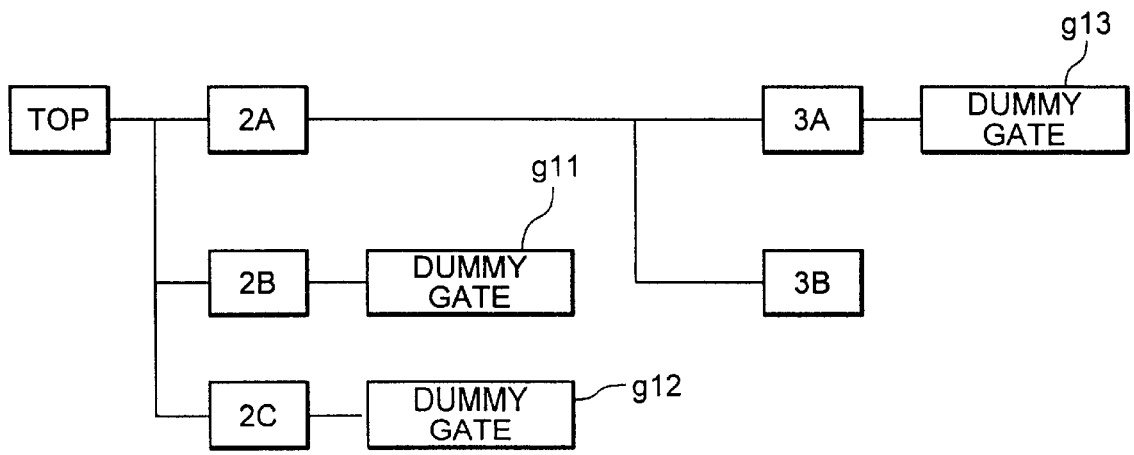
FIG. 2 is a schematic diagram showing a conventional netlist having dummy gates inserted therein.
Figure 3:
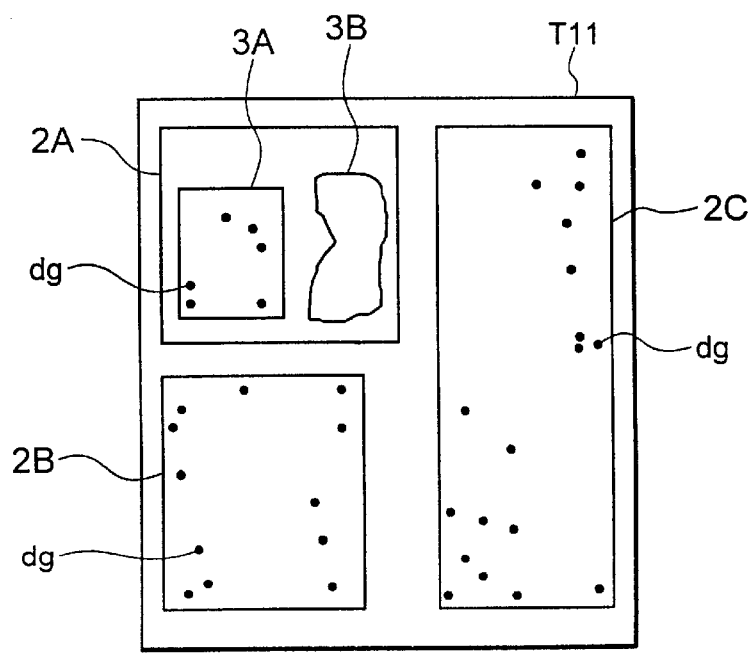
FIG. 3 is a schematic diagram showing dummy gates being arranged irregularly within individual modules on a semiconductor chip with in-module divisions.
Figure 4:
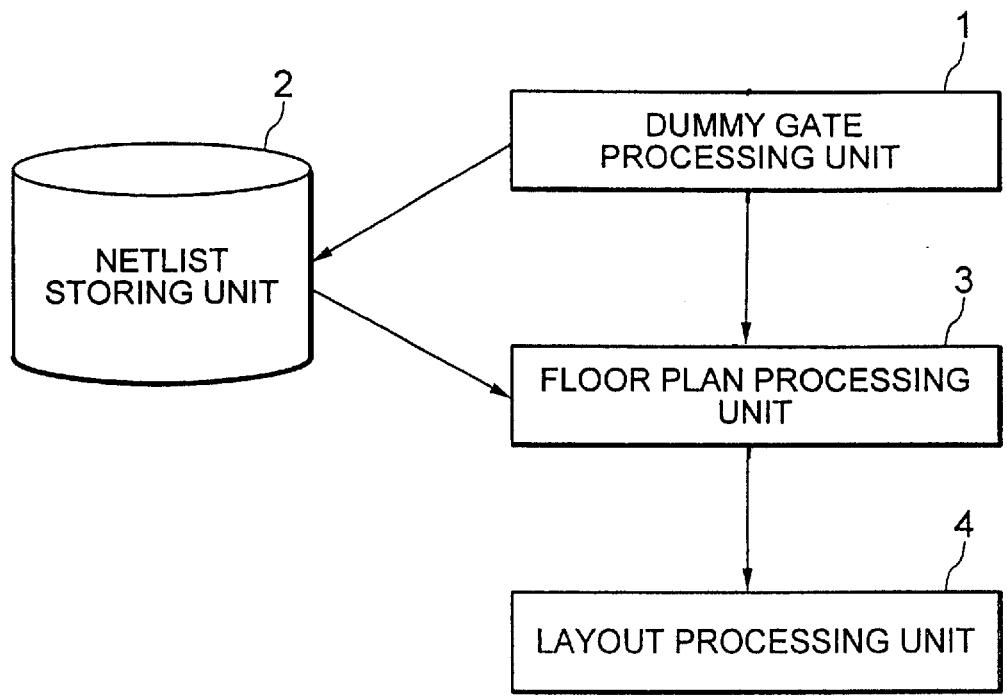
FIG. 4 is a block diagram showing an integrated circuit layout system according to a first embodiment of the present invention.
Figure 5:
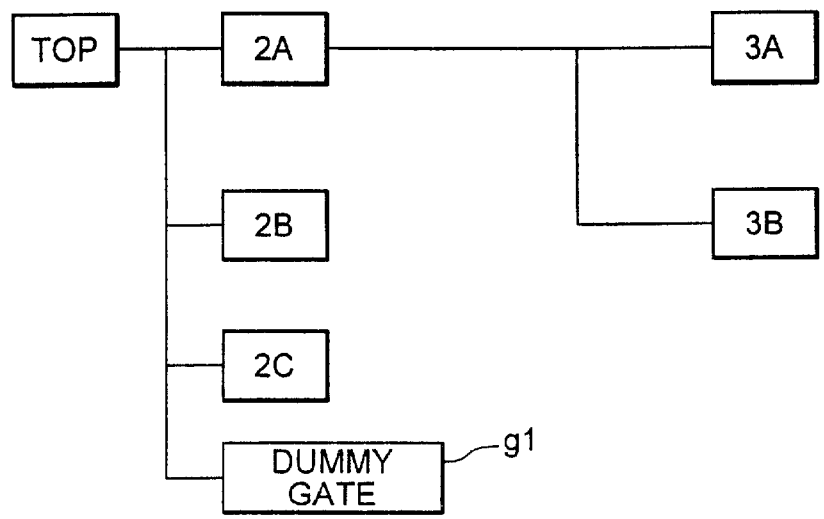
FIG. 5 is a schematic diagram showing a dummy-gate-included netlist to be stored in a netlist storing unit according to the first embodiment of the present invention.

FIG. 4 is a block diagram showing an integrated circuit layout system according to a first embodiment of the present invention. FIG. 5 is a schematic diagram showing a dummy-gate-included netlist to be stored in a netlist storing unit according to the first embodiment of the present invention. The integrated circuit layout system according to the present embodiment comprises a dummy gate processing unit 1, a netlist storing unit 2, a floor plan processing unit 3, and a layout processing unit 4.

The dummy gate processing unit 1 obtains a netlist defining circuit element connections, generated by a predetermined logic designing apparatus or the like, and inserts dummy gate information into the netlist obtained. The dummy gate processing unit 1 supplies the netlist including the dummy gate information to the netlist storing unit 2 for storage.

The netlist storing unit 2 stores the netlist including the dummy gate information inserted by the dummy gate processing unit 1. For example, the netlist storing unit 2 stores a netlist including a dummy gate g1 at the top level of the hierarchy as shown in FIG. 5.

As shown in FIG. 4, the floor plan processing unit 3 performs module divisions and grouping based on the netlist stored in the netlist storing unit 2. Besides, the floor plan processing unit 3 distributes dummy gates to the individual modules divided and the like.

The layout processing unit 4 determines the on-semiconductor-chip coordinates of the dummy gates distributed to the modules and the like. Then, the layout processing unit 4 arranges the dummy gates onto their respective coordinates and wires the same.

Figure 6:
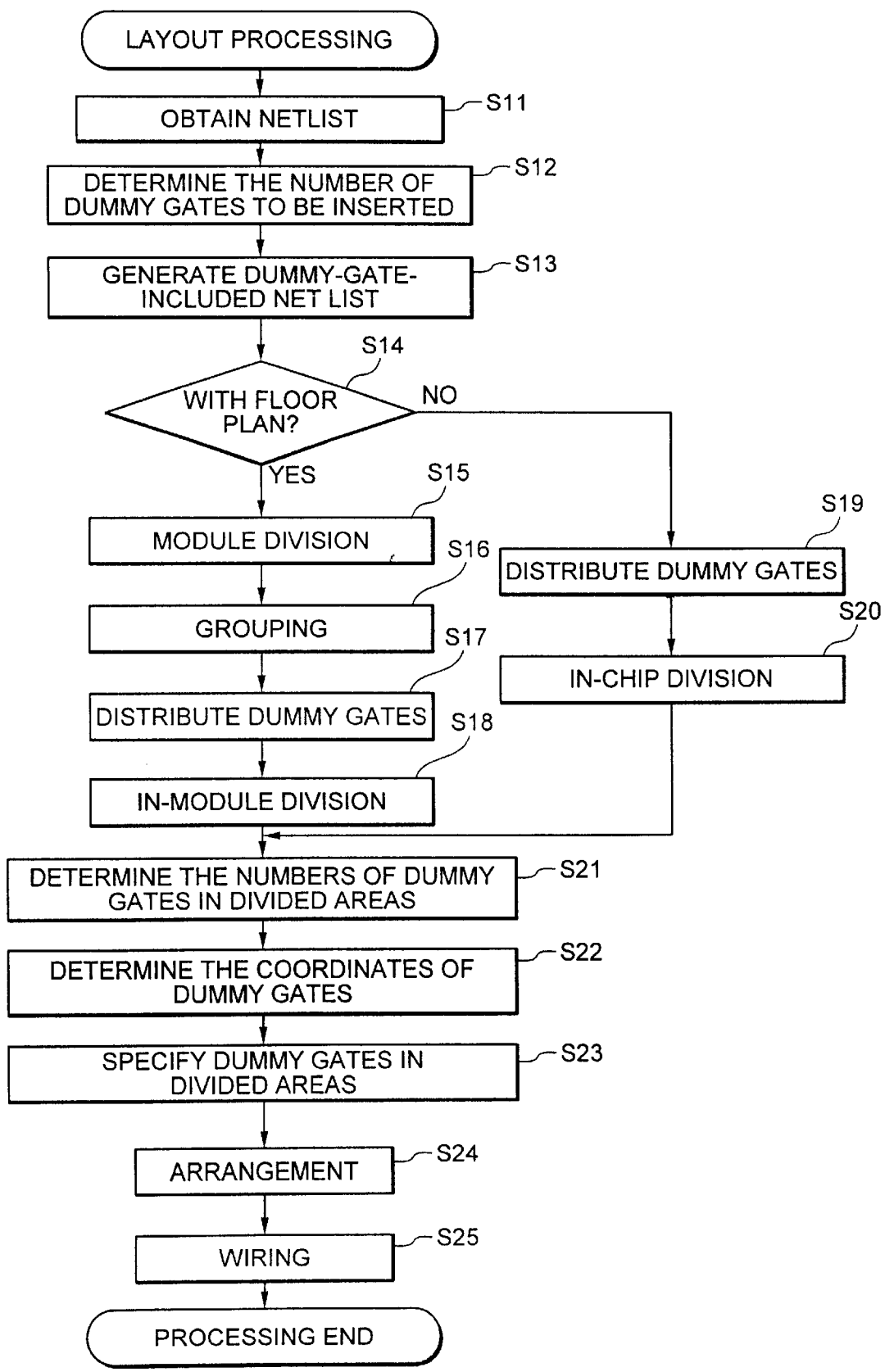
FIG. 6 is a flowchart showing layout processing steps in an integrated circuit layout method according to the first embodiment of the present invention.

FIG. 6 is a flowchart showing layout processing steps in an integrated circuit layout method according to the first embodiment of the present invention. Now, description will be given of the layout processing to be performed by the integrated circuit layout system according to the first embodiment. This layout processing is started after a netlist defining circuit element connections is supplied from a logic designing apparatus (not shown) or the like.

Initially, the dummy gate processing unit 1 obtains the netlist sent from the predetermined logic designing apparatus (step S11). Then, in accordance with the number of functional blocks specified arbitrarily, the dummy gate processing unit 1 determines the number of dummy gates to be inserted into the netlist obtained (step S12). Incidentally, the number of dummy gates to be inserted here may be determined with reference to other factors. For example, the dummy gate processing unit 1 can determine the number of dummy gates to be inserted based on the number of certain blocks in use.

The dummy gate processing unit 1 generates a netlist having dummy gates inserted therein in accordance with the number of to-be-inserted dummy gates determined (step S13). Here, the dummy gate processing unit 1 generates a netlist including the dummy gate g1 at the top level of the hierarchy as shown in FIG. 5. The dummy gate processing unit 1 supplies the netlist generated to the netlist storing unit 2 for storage.

After the netlist having the dummy gates inserted therein is stored into the netlist storing unit 2, the floor plan processing unit 3 determines the presence or absence of a floor plan (step S14). If a floor plan is determined to be necessary, the floor plan processing unit 3 makes module divisions in accordance with the netlist stored in the netlist storing unit 2 (step S15), and then performs grouping (step S16).

To the individual target modules divided, the floor plan processing unit 3 distributes dummy gates in the numbers determined in accordance with the numbers of gates in use (step S17). Incidentally, the numbers of dummy gates to be distributed here may be determined with reference to other factors. For example, the floor plan processing unit 3 can determine the numbers of dummy gates to be distributed based on the number of blocks specified arbitrarily or the number of certain blocks in use.

Figure 7:
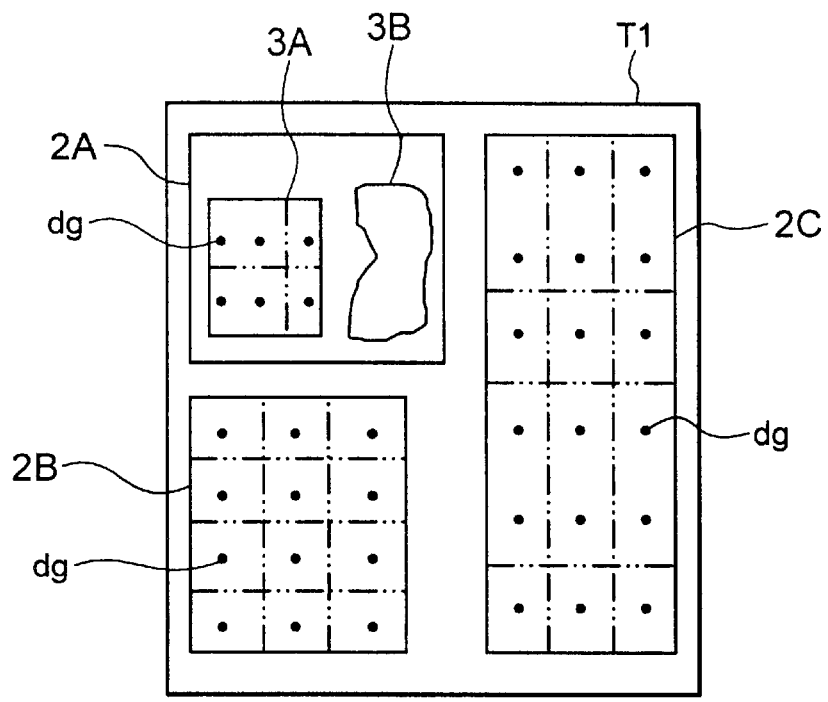
FIG. 7 is a schematic diagram showing dummy gates being arranged uniformly within individual modules on a semiconductor chip with in-module divisions.

FIG. 7 is a schematic diagram showing dummy gates being arranged uniformly within individual modules on a semiconductor chip with in-module divisions. Then, the floor plan processing unit 3 makes divisions inside each target module (step S18). That is, as shown in FIG. 7, individual modules 2B, 2C, and 3A on the semiconductor chip T1 are divided inside according to certain rules established in advance.

On the other hand, if it is determined at step S14 that no floor plan is needed, then the floor plan processing unit 3 distributes as many dummy gates as determined in accordance with the number of gates in use, over the entire semiconductor chip (step S19). Incidentally, the number of dummy gates to be distributed here may be determined with reference to other factors. For example, the floor plan processing unit 3 can determine the number of dummy gates to be distributed based on the number of blocks specified arbitrarily or the number of certain blocks in use.

Figure 8:
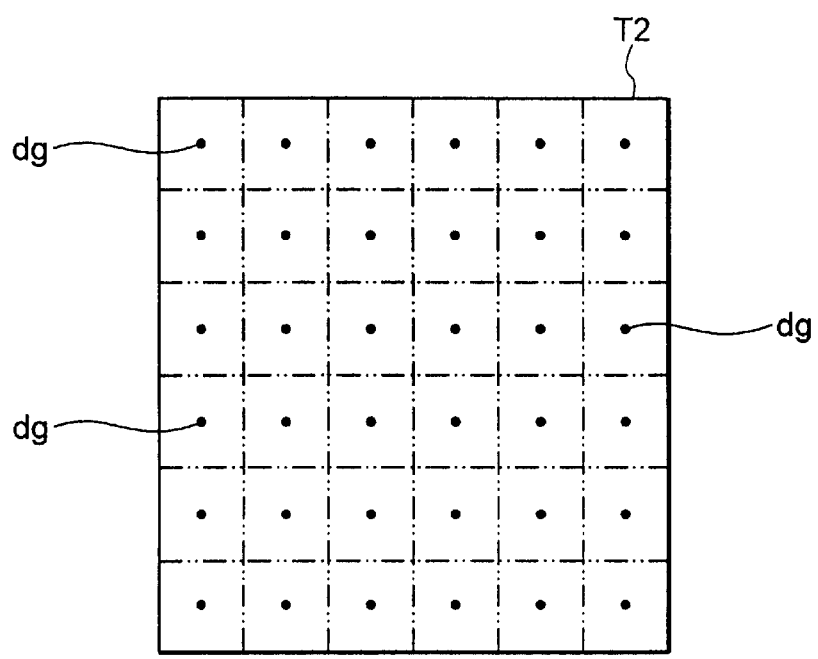
FIG. 8 is a schematic diagram showing dummy gates being arranged uniformly over a semiconductor chip.

FIG. 8 is a schematic diagram showing dummy gates being arranged uniformly within a semiconductor chip. Then, the floor plan processing unit 3 makes in-chip divisions (step S20). That is, as shown in FIG. 8, the semiconductor chip T2 is divided inside according to certain rules established in advance.

After the in-module divisions or the in-chip divisions are made by the floor plan processing unit 3, the layout processing unit 4 determines the number of dummy gates in each divided area (step S21). More specifically, the layout processing unit 4 determines the number of dummy gates for each divided area by dividing the number of dummy gates by the number of divided areas.

In accordance with the number of dummy gates determined for each divided area, the layout processing unit 4 determines the coordinates of the individual dummy gates according to certain rules established in advance (step S22).

That is, in the cases where the semiconductor chip T1 has undergone the in-module divisions as shown in FIG. 7, the layout processing unit 4 determines such coordinates that the dummy gates dg are arranged uniformly within the modules 2B, 2C, and 3A. In the cases where the semiconductor chip T2 has been divided inside as shown in FIG. 8, the layout processing unit 4 determines such coordinates that the dummy gates dg are arranged uniformly over the chip.

Incidentally, when the number of dummy gates for each divided area is not an integer, the layout processing unit 4 determines the coordinates of the remaining dummy gates so that those dummy gates lie close to the divided areas.

Next, the layout processing unit 4 specifies the dummy gates in the divided areas (step S23). Then, all cells are arranged (step S24) and all the net wiring is installed (step S25).

This makes it possible to arrange dummy gates uniformly within a semiconductor chip or within each module. In such a semiconductor chip with uniformly-arranged dummy gates, the dummy gates can be effectively used to redesign (rewire) the connections of those correction-requiring portions alone within the range of allowable delays and the like or within the fan-out specifications even when post-design defects occur. This allows a reduction in development TAT. Incidentally, the first embodiment described above has dealt with the case of using no hard macro, whereas hard macros may be used in layout.

Now, description will be given of an integrated circuit layout system according to a second embodiment. The present embodiment uses hard macros for layout. The integrated circuit layout system according to the second embodiment of the present invention has substantially the same configuration (not shown) as that of the integrated circuit layout system according to the first embodiment shown in FIG. 4.

Figure 9:
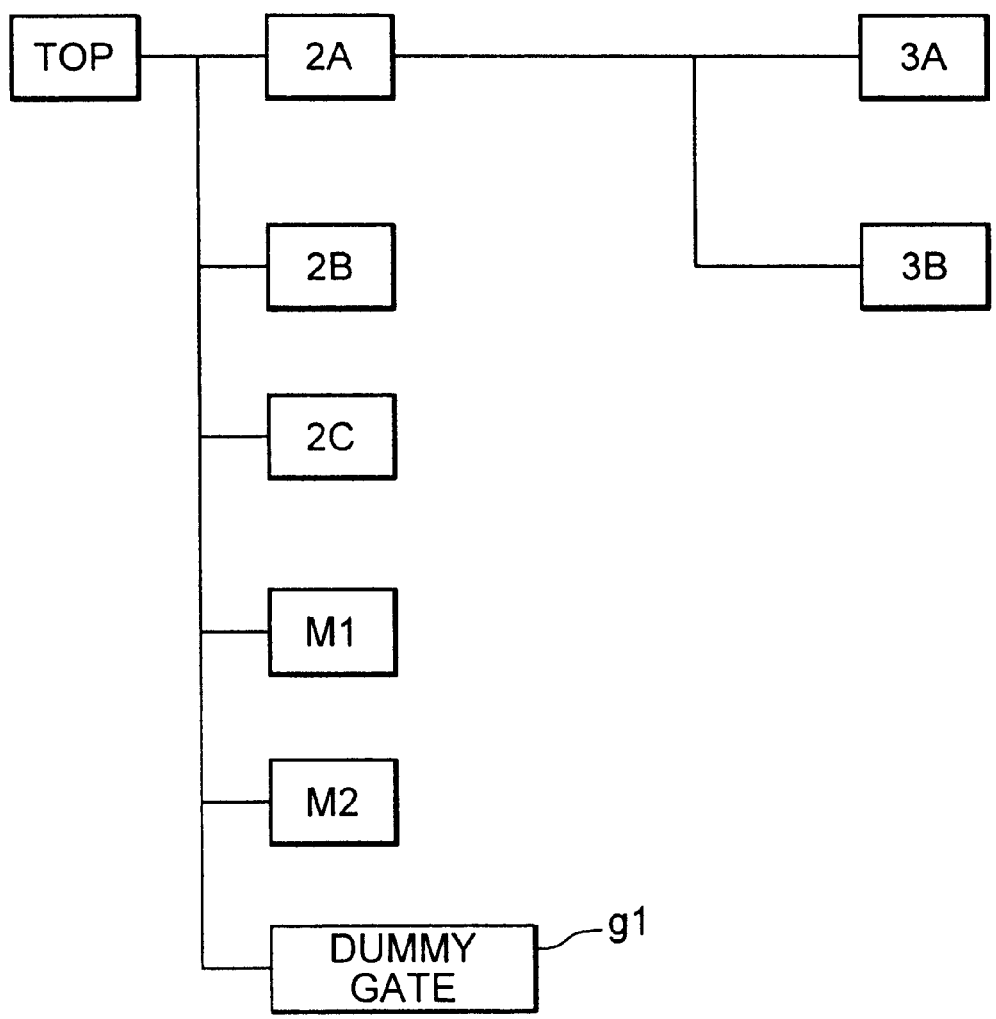
FIG. 9 is a schematic diagram showing a dummy-gate-included netlist to be stored in a netlist storing unit according to a second embodiment of the present invention.

In the present embodiment, the dummy gate processing unit 1 obtains a netlist including hard macros defining circuit element connections, generated by a predetermined logic designing apparatus or the like, and inserts dummy gate information into the netlist obtained. The dummy gate processing unit 1 supplies the netlist including the dummy gate information to the netlist storing unit 2 for storage. More specifically, the netlist storing unit 2 stores a netlist having a dummy gate g1 at the top level of the netlist hierarchy as shown in FIG. 9 including hard macros.

Figure 10:
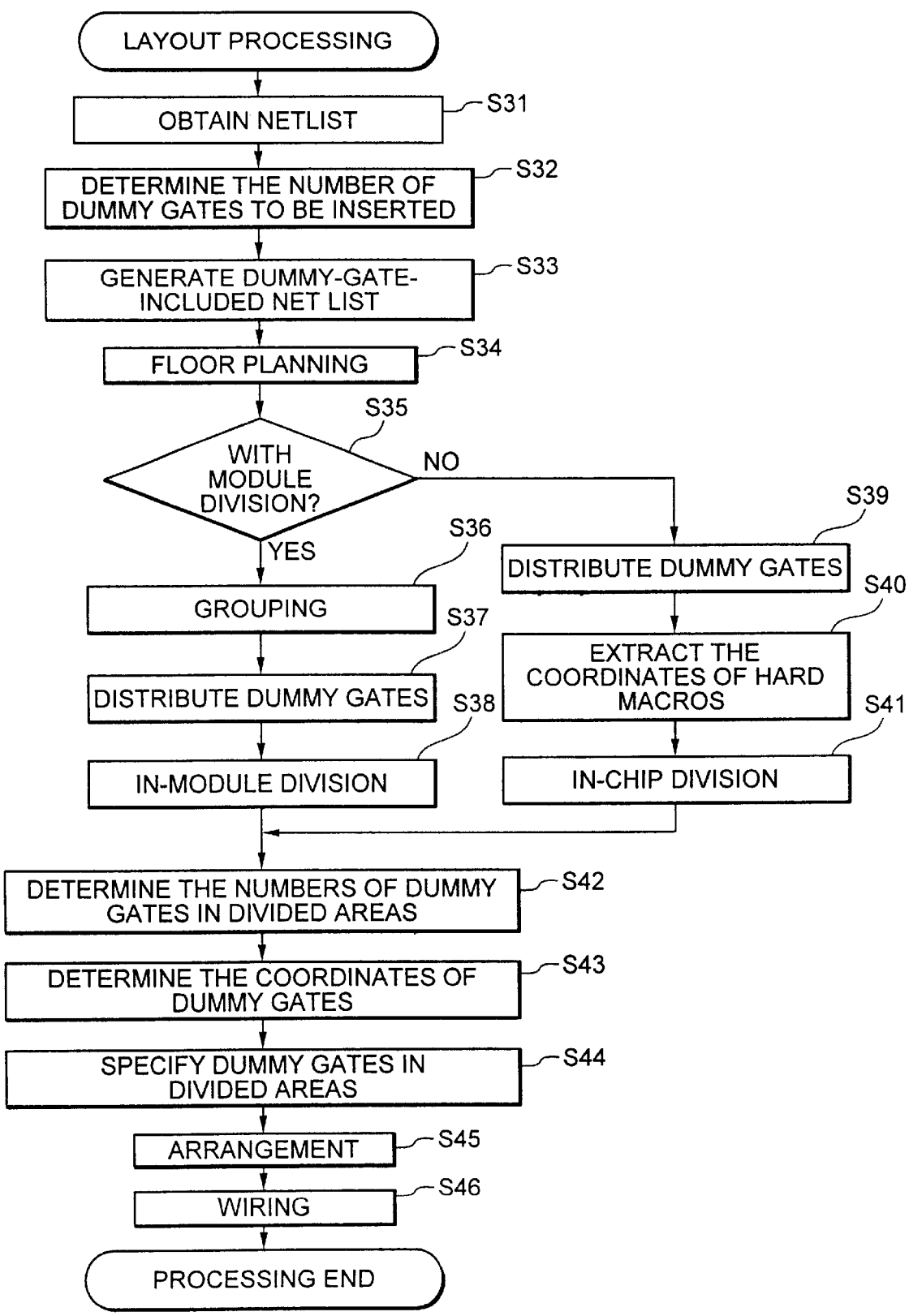
FIG. 10 is a flowchart for explaining the layout processing under an integrated circuit layout method according to the second embodiment of the present invention.

FIG. 10 is a flowchart for explaining the layout processing in an integrated circuit layout method according to the second embodiment of the present invention. Description will now be given of the layout processing to be performed by the integrated circuit layout system according to the second embodiment. This layout processing is started after a netlist including hard macros defining design-based circuit element connections is supplied from a logic designing apparatus (not shown).

Initially, the dummy gate processing unit 1 obtains the hard-macro-included netlist sent from the predetermined logic designing apparatus (step S31). Then, the dummy gate processing unit 1 determines the number of dummy gates to be inserted into the obtained netlist in accordance with the number of functional blocks specified arbitrarily (step S32).

The dummy gate processing unit 1 generates a netlist having dummy gates inserted therein in accordance with the number of to-be-inserted dummy gates determined (step S33). That is, as shown in FIG. 9, a netlist including the dummy gate g1 at the top level of the hierarchy is generated. The dummy gate processing unit 1 supplies the netlist generated to the netlist storing unit 2 for storage.

After the netlist having dummy gates inserted therein is stored into the netlist storing unit 2, the floor plan processing unit 3 performs floor planning (step S34). The floor plan processing unit 3 determines the presence or absence of module divisions (step S35). If module divisions are determined to be necessary, the floor plan processing unit 3 makes module divisions according to the netlist stored in the netlist storing unit 2, and performs grouping (step S36).

To the individual target modules divided, the floor plan processing unit 3 distributes dummy gates in the numbers determined based on the numbers of gates in use (step S37).

Figure 11:
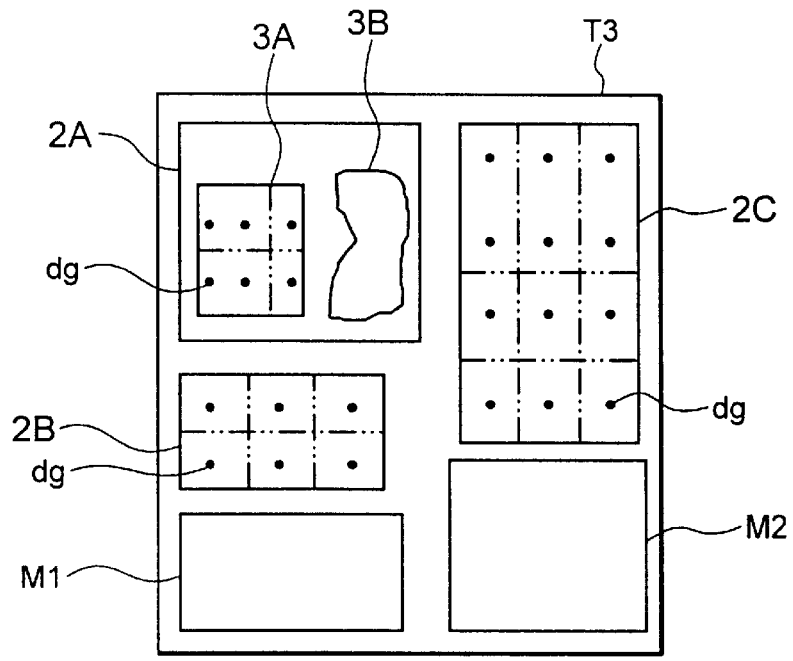
FIG. 11 is a schematic diagram showing dummy gates being arranged uniformly within individual modules when in-module divisions are made on a semiconductor chip which includes hard macro areas.
Figure 12:
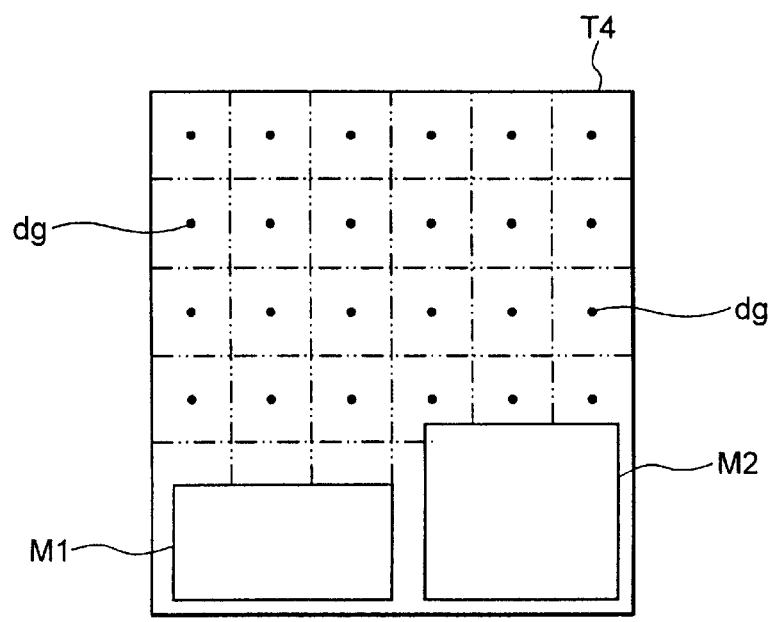
FIG. 12 is a schematic diagram showing dummy gates being arranged uniformly over a semiconductor chip which includes hard macro areas.

FIG. 11 is a schematic diagram showing dummy gates being arranged uniformly within individual modules when in-module divisions are made on a semiconductor chip including hard macro areas. FIG. 12 is a schematic diagram showing dummy gates being arranged uniformly over a semiconductor chip including hard macro areas. Then, the floor plan processing unit 3 performs divisions inside each target module (step S38). More specifically, as shown in FIG. 11, modules 2B, 2C, and 3A on a semiconductor chip T3 provided with hard macro areas M1 and M2 are divided in accordance with certain rules established in advance.

On the other hand, if it is determined at step S35 that no module division is needed, then the floor plan processing unit 3 distributes as many dummy gates as determined in accordance with the number of gates in use, over the entire semiconductor chip (step S39).

Then, the floor plan processing unit 3 extracts the coordinates of the hard macros (step S40), and then makes in-chip divisions (step S41). More specifically, as shown in FIG. 12, the entire area of the semiconductor chip T4 except the hard macro areas M1 and M2 is divided in accordance with certain rules established in advance.

After the in-module divisions or the in-chip divisions are made by the floor plan processing unit 3, the layout processing unit 4 determines the number of dummy gates in each divided area (step S42).

In accordance with the number of dummy gates determined for each divided area, the layout processing unit 4 determines the coordinates of the individual dummy gates based on certain rules established in advance (step S43). That is, in the cases where the semiconductor chip T3 has undergone the in-module divisions as shown in FIG. 11, the layout processing unit 4 determines each coordinates that the dummy gates dg are arranged uniformly within the modules 2B, 2C, and 3A. In the cases where the semiconductor chip T4 has been divided inside as shown in FIG. 12, the layout processing unit 4 determines such coordinates that the dummy gates dg are arranged uniformly over the area excepting the hard macro areas M1 and M2.

The layout processing unit 4 specifies the dummy gates in the divided areas (step S44). Then, all cells are arranged (step S45) and all the net wiring is installed (step S46).

This makes it possible to arrange dummy gates uniformly within a semiconductor chip or within each module even in the cases of using hard macros. In such a semiconductor chip with uniformly-arranged dummy gates, the dummy gates can be effectively used to redesign (rewire) the connections of those correction-requiring portions alone within the range of allowable delays and the like or within the fan-out specifications even when post-design defects occur. This allows a reduction in development TAT.

Note that the integrated circuit layout systems according to the present invention can be realized through the use of an ordinary computer system, not a dedicated system. For example, an integrated circuit layout system for performing the layout processing according to either of the embodiments described above can be constructed by installing a program for executing that processing from a medium (a floppy disk, CD-ROM, or the like) storing the program.

Besides, the medium for supplying those programs to a computer may be a communication medium (a medium which holds the programs temporarily and flexibly, such as a communication line, a communication network, and a communication system). For example, the programs may be put on a bulletin board (BBS) on a communication network and delivered through the network.

Then, the programs can execute the processing described above by being activated and run under OS control like other application programs.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An integrated circuit layout system comprising:
   a dummy gate inserting unit for inserting dummy gate information into a netlist defining connections of circuit elements constituting an integrated circuit;
   a dummy gate distributing unit for distributing a predetermined number of dummy gates to modules of the integrated circuit in accordance with said netlist, said netlist having dummy gate information inserted therein by said dummy gate inserting unit; and
   a dummy gate arranging unit for arranging said predetermined number of dummy gates uniformly within areas on a chip corresponding to said modules.

2. An integrated circuit layout system comprising:
   a dummy gate inserting unit for inserting dummy gate information into a netlist defining connections of circuit elements constituting an integrated circuit;
   an area designating unit for designating a plurality of areas on a chip to arrange said circuit elements in accordance with said netlist;
   a dummy gate distributing unit for distributing a predetermined number of dummy gates to said plurality of areas; and
   a dummy gate arranging unit for arranging said predetermined number of dummy gates uniformly within said respective areas on the chip.

3. An integrated circuit layout method comprising:
   inserting dummy gate information into a netlist defining connections of circuit elements constituting an integrated circuit;
   distributing a predetermined number of dummy gates to modules of the integrated circuit in accordance with said netlist having dummy gate information inserted therein; and
   arranging said predetermined number of dummy gates so that the dummy gates are distributed uniformly within said respective modules corresponding to areas on a chip.

4. An integrated circuit layout method comprising:
   inserting dummy gate information into a netlist defining connections of circuit elements constituting an integrated circuit;
   designating a plurality of areas on a chip to arrange circuit elements in accordance with said netlist having dummy gate information inserted therein;
   distributing a predetermined number of dummy gates to said areas; and
   arranging said predetermined number of dummy gates uniformly within said respective areas on the chip.

5. A computer-readable storage medium storing a program for causing a computer to perform an integrated circuit layout process comprising:
   inserting dummy gate information into a netlist defining connections of circuit elements constituting an integrated circuit;
   distributing a predetermined number of dummy gates to modules of the integrated circuit in accordance with said netlist having dummy gate information inserted therein; and
   arranging said predetermined number of dummy gates uniformly within said respective modules corresponding to areas on a chip.

6. A computer-readable storage medium storing a program for causing a computer to perform an integrated circuit layout process comprising:
   inserting dummy gate information into a netlist defining connections of circuit elements constituting an integrated circuit;
   designating a plurality of areas on a chip to arrange said circuit elements in accordance with said netlist having dummy gate information inserted therein;
   distributing a predetermined number of dummy gates to said areas; and
   arranging said predetermined number of dummy gates uniformly within said respective areas on the chip.

7. An integrated circuit layout system comprising:
   a dummy gate inserting unit for inserting dummy gate information into a netlist defining connections of circuit elements constituting an integrated circuit;
   a dummy gate distributing unit for distributing a predetermined number of dummy gates to modules in accordance with said netlist having dummy gate information inserted therein by said dummy gate inserting unit;
   a dummy gate arranging unit for arranging said predetermined number of dummy gates uniformly within respective modules corresponding to areas on a chip; and
   wherein said dummy gate information includes at least a total number of dummy gates which are inserted into a top level of the netlist, wherein the netlist is hierarchical; and
   wherein said dummy gate distributing unit distributes said predetermined number of dummy gates included in said dummy gate information in accordance with a number of circuit elements targeted for the distribution.

8. An integrated circuit layout system comprising:
   a dummy gate inserting unit for inserting dummy gate information into a netlist defining connections of circuit elements constituting an integrated circuit;
   an area designating unit for designating a plurality of areas on a chip to arrange said circuit elements in accordance with said netlist having dummy gate information inserted therein by said dummy gate inserting unit;
   a dummy gate distributing unit for distributing a predetermined number of dummy gates to said plurality of areas;
   a dummy gate arranging unit for arranging said predetermined number of dummy gates uniformly within said respective areas on the chip; and
   wherein said dummy gate information includes at least a total number of dummy gates which are inserted into a top level of the netlist, wherein the netlist is hierarchical; and
   wherein said dummy gate distributing unit distributes said predetermined number of dummy gates in accordance with a number of circuit elements targeted for the distribution.

9. An integrated circuit layout system comprising:
   a dummy gate inserting unit for inserting dummy gate information into a netlist defining connections of circuit elements constituting an integrated circuit;
   a dummy gate distributing unit for distributing a predetermined number of dummy gates to modules in accordance with said netlist having dummy gate information inserted therein by said dummy gate inserting unit;
   a dummy gate arranging unit for arranging said predetermined number of dummy gates uniformly within respective modules corresponding to areas on a chip; and wherein one or more of said predetermined number of dummy gates is used to redesign said connections of said integrated circuit.

10. An integrated circuit layout system comprising:

a dummy gate inserting unit for inserting dummy gate information into a netlist defining connections of circuit elements constituting an integrated circuit;

an area designating unit for designating a plurality of areas on a chip to arrange circuit elements in accordance with said netlist having dummy gate information inserted therein by said dummy gate inserting unit;

a dummy gate distributing unit for distributing a predetermined number of dummy gates to said areas;

a dummy gate arranging unit for arranging said predetermined number of dummy gates uniformly within said respective areas on the chip; and wherein one or more of said predetermined number of dummy gates is used to redesign said connections of said integrated circuit.

* * * * *